United States Patent
Chang et al.

(10) Patent No.: US 8,252,652 B2
(45) Date of Patent: Aug. 28, 2012

(54) SEMICONDUCTOR STRUCTURE AND FABRICATION METHOD THEREOF

(75) Inventors: Yih-Jau Chang, Zhudong Township, Hsinchu County (TW); Shang-Hui Tu, Tainan (TW); Gene Sheu, Wufeng Township, Taichung County (TW); Yi-Fong Chang, Dali (TW); Nithin Devarajulu Palavalli, Wufeng Township, Taichung County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 213 days.

(21) Appl. No.: 12/748,703

(22) Filed: Mar. 29, 2010

(65) Prior Publication Data

US 2011/0233672 A1    Sep. 29, 2011

(51) Int. Cl.
*H01L 21/336* (2006.01)
*H01L 29/06* (2006.01)

(52) U.S. Cl. .................. 438/286; 257/339; 257/328

(58) Field of Classification Search .................. 257/344, 257/E29.437, 163
See application file for complete search history.

(56) References Cited

U.S. PATENT DOCUMENTS

| 2010/0025756 A1* | 2/2010 | Fu et al. ..................... 257/328 |
| 2011/0198692 A1* | 8/2011 | Chang et al. ................ 257/339 |

* cited by examiner

*Primary Examiner* — Fernando L Toledo
*Assistant Examiner* — Valerie N Brown
(74) *Attorney, Agent, or Firm* — Birch, Stewart, Kolasch & Birch, LLP

(57) ABSTRACT

A semiconductor structure is provided. A second conductivity type well region is formed on a first conductivity type substrate. A second conductivity type diffused source and second conductivity type diffused drain are formed on the first conductivity type substrate. A gate structure is formed on the second conductivity type well region between the second conductivity type diffused source and the second conductivity type diffused drain. First conductivity type buried rings are arranged in a horizontal direction, and formed in the second conductivity type well region, and divide the second conductivity type well region into an upper drift region and a lower drift region.

17 Claims, 10 Drawing Sheets

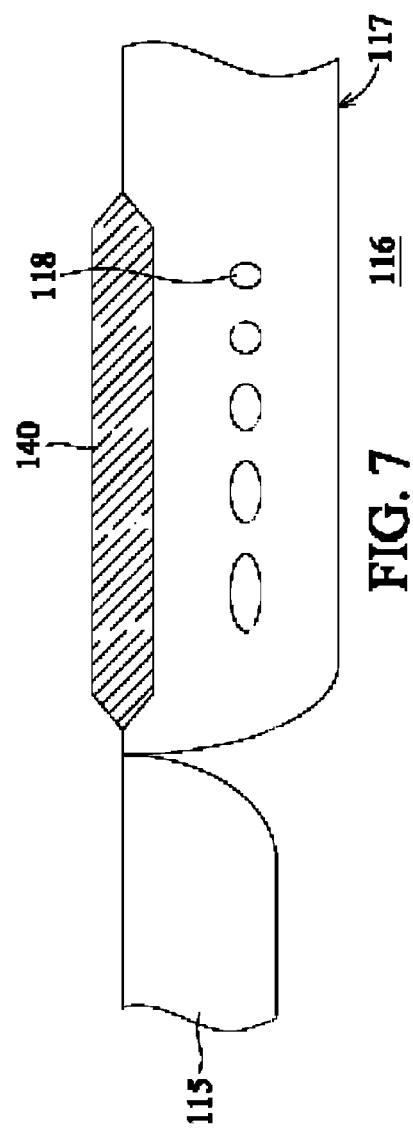
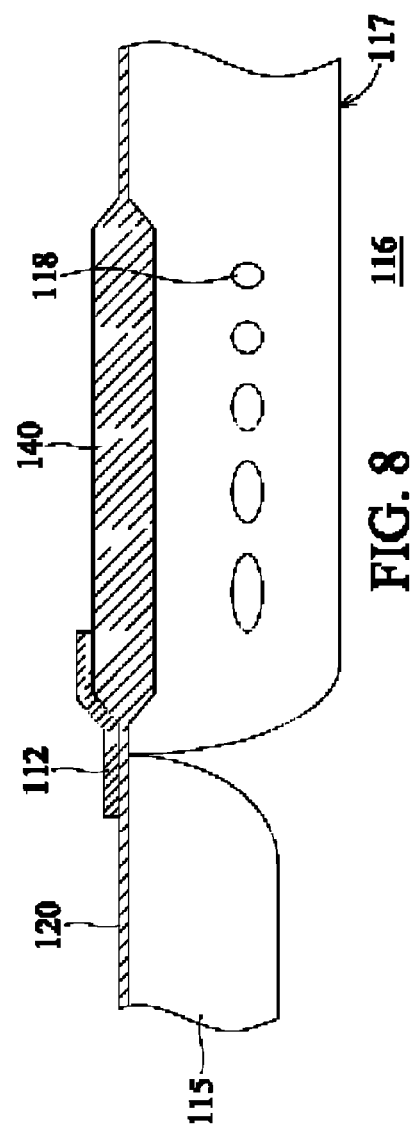

SEMICONDUCTOR STRUCTURE AND FABRICATION METHOD THEREOF

BACKGROUND OF THE INVENTION

1. Field of the Invention

The present invention relates to a semiconductor structure and fabrication method thereof, and particularly, to a lateral diffused metal oxide semiconductor with a breakdown voltage which is higher than 800V and a fabrication method thereof.

2. Description of the Related Art

Single-chip systems have been developed, which comprise controllers, memory devices, low-voltage (LV) circuits and high-voltage (HV) power devices. For example, double-diffused metal oxide semiconductor (DMOS) transistors, which are frequently used as conventional power devices, operate with low on-resistance and high voltage. Moreover, by using very-large-scale integration (VLSI) technology, a high-voltage lateral diffused metal oxide semiconductor (LDMOS) may have higher on-resistance than a commonly used vertical double-diffused metal oxide semiconductor (VDMOS).

When designing a transistor, high breakdown voltage and low on-resistance are two main concerns. Recently, reduced surface electrical field (RESURF) technology has been adopted in fabrication of an LDMOS. FIG. 1 is an illustration of an N-type LDMOS device using a RESURF concept in U.S. Pat. No. 6,773,997 B2. An N-type well 413 is extended from a channel region 415 to an N$^+$-type drain 406. A uniformly doped flat P-type region 408 is formed on the N-type well 413. When the device operates with an applied voltage, the N-type well 413 functions as a carrier drift region, and the P-type region 408 functions as a RESURF layer. U.S. Pat. No. 6,773,997 B2 further describes a device having a plurality of layers of uniformly doped flat P-type regions 408, 402, as shown in FIG. 2.

Referring to FIG. 2, the N-type well 413 can be easily depleted since it is disposed between the flat P-type region 408, 402 and the P-type substrate 401. Therefore, the N-type well 413 can be formed with a high dosage of dopants to reduce on-resistance of a device made therefrom. However, for the LDMOS device in an off-state, electrical fields therein are concentrated around the N$^+$-type drain 406. Thus, an electrical field (or current) crowding effect occurs, resulting in a decrease in breakdown voltage and switching speed. While the doping concentration of the N-type well 413 may be decreased to increase the degree of depleting the N-type well 413, resulting in a higher breakdown voltage, the on-resistance of the LDMOS device would also increase. Thus, a semiconductor structure and fabrication method for UHV devices having a high breakdown voltage and low on-resistance is desired.

BRIEF SUMMARY OF INVENTION

A detailed description is given in the following embodiments with reference to the accompanying drawings.

The invention provides a semiconductor structure. A second conductivity type well region is formed on a first conductivity type substrate. A second conductivity type diffused source and second conductivity type diffused drain are formed on the first conductivity type substrate. A gate structure is formed on the second conductivity type well region between the second conductivity type diffused source and the second conductivity type diffused drain. First conductivity type buried rings are arranged in a horizontal direction, and formed in the second conductivity type well region, and divide the second conductivity type well region into an upper drift region and a lower drift region.

The invention also provides a method for forming a semiconductor structure. A second conductivity type well region is formed on a first conductivity type substrate. A second conductivity type diffused source and second conductivity type diffused drain are formed on the first conductivity type substrate. A gate structure is formed on the second conductivity type well region between the second conductivity type diffused source and the second conductivity type diffused drain. First conductivity type buried rings are arranged in a horizontal direction in the second conductivity type well region, and the first conductivity type buried rings divides the second conductivity type well region into an upper drift region and a lower drift region.

BRIEF DESCRIPTION OF DRAWINGS

The present invention can be more fully understood by reading the subsequent detailed description and examples with references made to the accompanying drawings, wherein:

FIGS. 3 to 11 are cross-section views illustrating the method for forming a semiconductor structure of one embodiment of the invention.

DETAILED DESCRIPTION OF INVENTION

Figure 1:
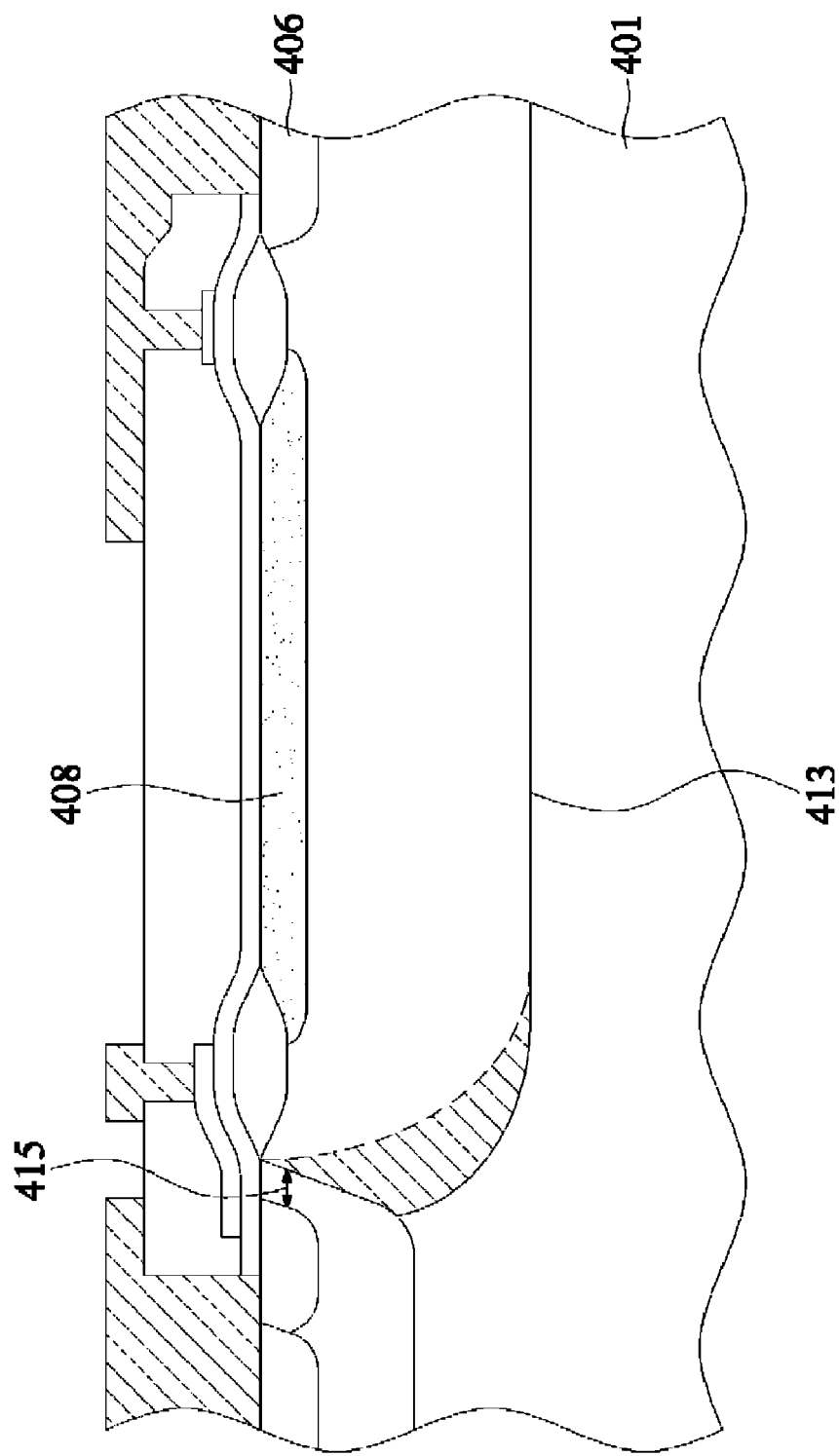
FIGS. 1 and 2 are cross-section views of semiconductor structures of prior art.
Figure 2:
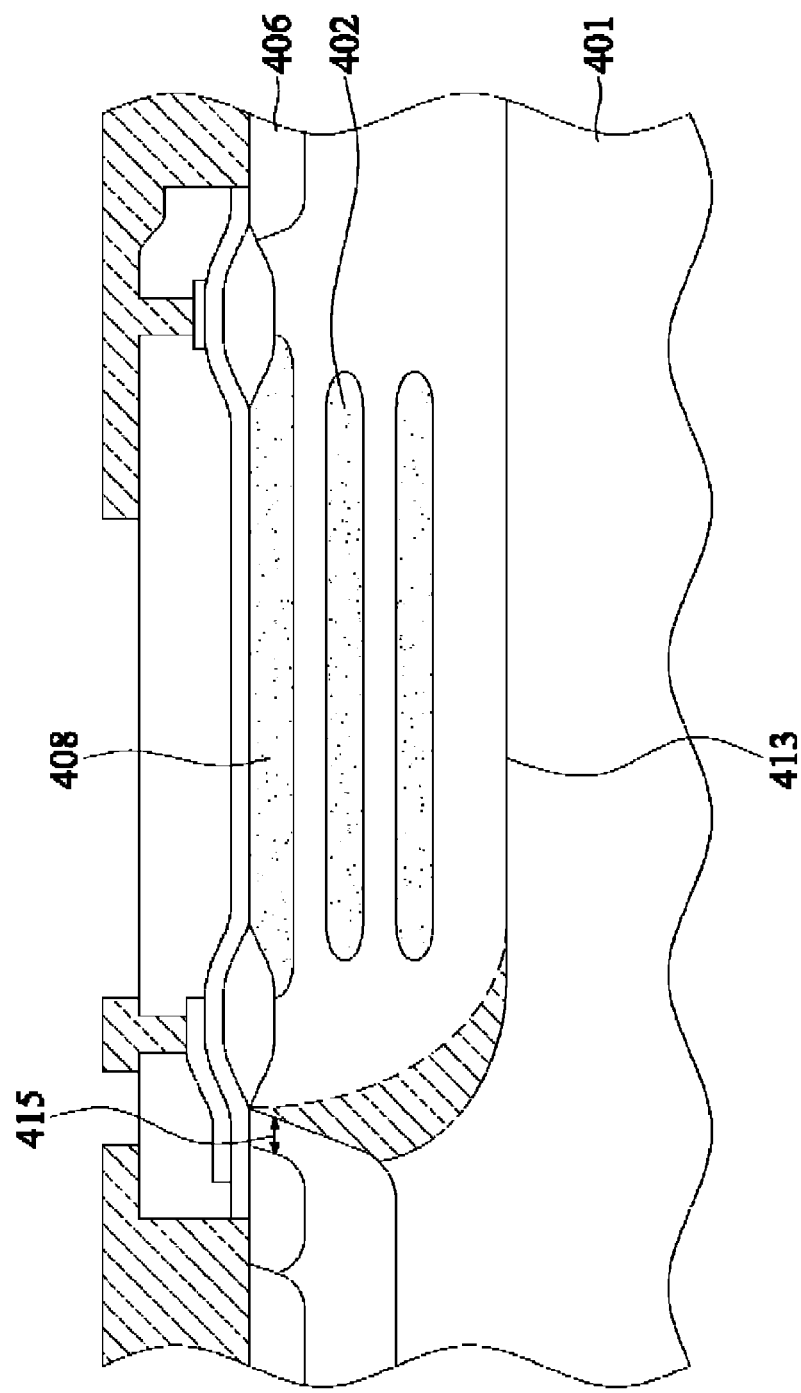

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a semiconductor structure and fabrication method thereof. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 3:
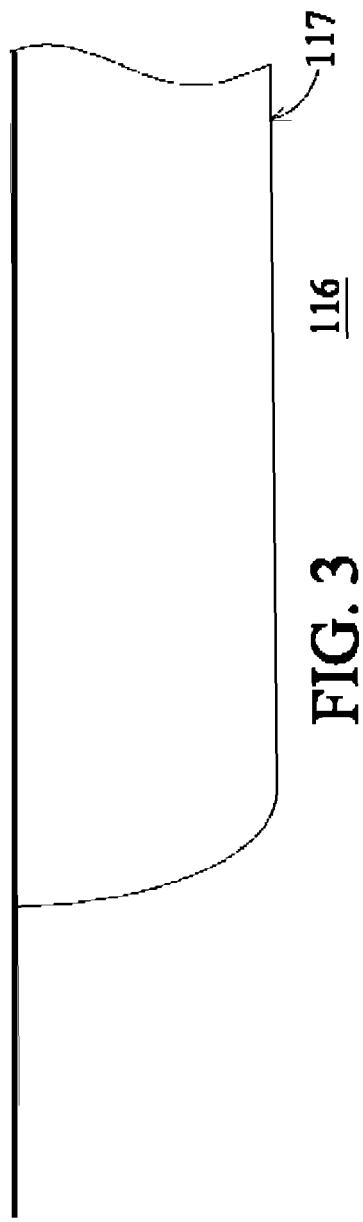

FIGS. 3 to 11 are cross-section views illustrating the method for forming an N-channel LDMOS of one embodiment of the invention. Referring to FIG. 3, an N-type well region 117 is formed in a P-type substrate 116. The N-type well region 117 may be formed by a conventional lithography process for forming a patterned mask layer (not shown) on the P-type substrate 116. An N-type dopant is implanted into the P-type substrate 116, and then the patterned mask layer is removed. The N-type dopant may comprise phosphorus, arsenic, nitrogen, antimony, or combinations thereof. The dopant dosage may be between about $2\times10^{12}/cm^2$ and about $1\times10^{13}/cm^2$. The implant energy may be between about 400 keV and about 600 keV. After implanting the N-type dopant, an annealing step may be performed. The annealing temperature may be between about 1000° C. and 1050° C. The annealing time may be between about 8 hours and about 15 hours. Thus, forming an N-type well region 117 which is diffused to a depth of about 5 μm and about 15 μm of the substrate 116.

Figure 4:
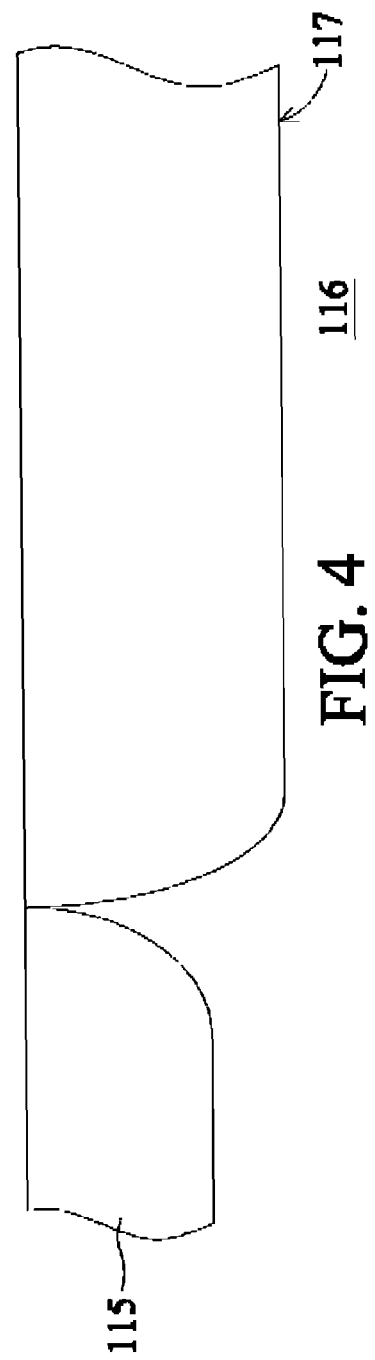

Referring to FIG. 4, a P-type well region 115 is formed in the P-type substrate 116. The P-type well region 115 and the N-type well region 117 are separated by the P-type substrate 116. The P-type well region 115 may be formed by a conventional lithography process for forming a patterned mask layer (not shown) on the P-type substrate 116. A P-type dopant is implanted into the P-type substrate 116, and then the patterned mask layer is removed. The P-type dopant may comprise boron, gallium, aluminum, indium, or combinations thereof. The dopant dosage may be between about $1\times10^{14}/cm^2$ and about $1\times10^{15}/cm^2$. The implant energy may be between about 100 keV and about 400 keV. After implanting the P-type dopant, an annealing step may be performed. The annealing temperature may be between about 1000° C. and 1050° C. The annealing time may be between about 3 hours and about 5 hours. Thus, forming the P-type well region 115 which is diffused to a depth of about 5 μm and about 15 μm of the substrate 116.

Figure 5:
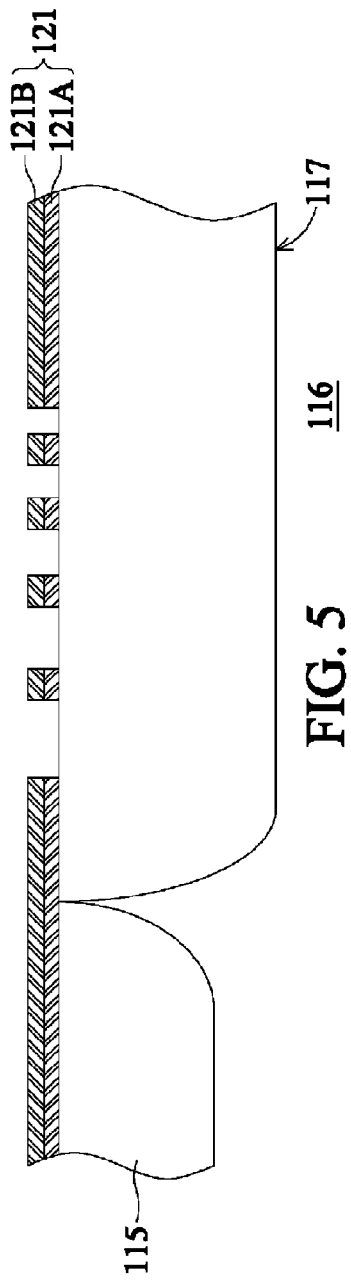

Referring to FIG. 5, a patterned mask 121 is formed on the P-type substrate 116. The mask layer 121 may comprise any suitable material such us silicon dioxide, silicon carbide, silicon nitride, silicon oxynitride, formed by a physical vapor deposition, chemical vapor deposition, plasma-enhanced chemical vapor deposition, high-density plasma chemical vapor deposition, or low-pressure chemical vapor deposition methods, or other suitable deposition methods or film-growth methods. In one embodiment, the mask layer 121 is made of a silicon dioxide deposited with a reaction of silane and oxygen. In other embodiments, the mask layer 121 is made of a silicon dioxide deposited with a reaction of tetraethoxysilane (TEOS) and ozone. In some embodiments, the mask layer 121 is made of a photoresist material. Alternatively, in one embodiment the mask layer 121 may be a structure composed of a silicon dioxide layer 121A and a photoresist layer 121B, as shown in FIG. 5. In one embodiment, an opening exposing a part of the N-type well region 117 is formed in the mask layer 121 by a lithography process using a photomask. The lithography process comprises the sequential process steps of coating a photoresist, exposing, developing, and removing the photoresist. A detailed description of the lithography process is not illustrated herein since it is well-known to those skilled in the art.

Figure 6:
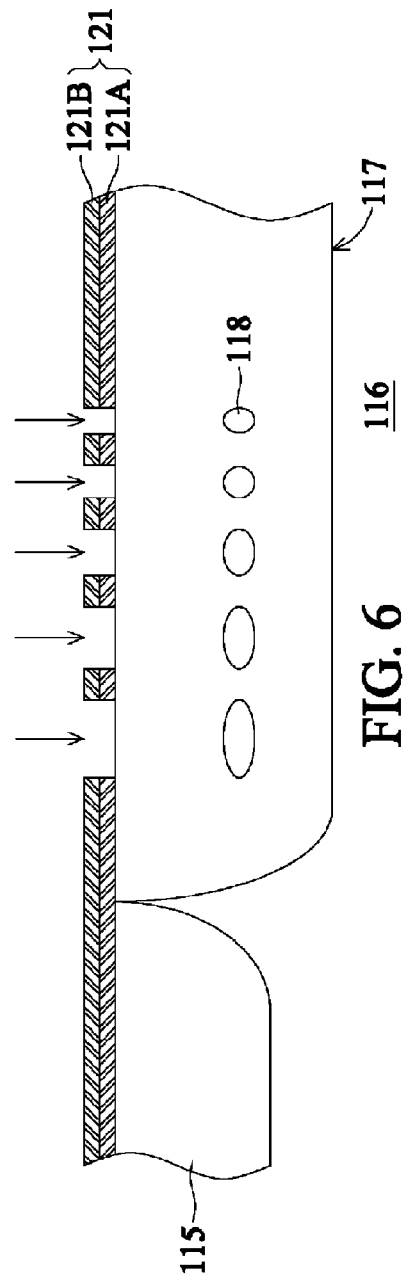

Referring to FIG. 6, then a plurality of P-type buried rings 118 may be formed in the N-type well region 117 exposed by the patterned mask layer 121 with one or more implanting processes. Next, an annealing step may be performed to diffuse the P-type buried rings 118 to suitable profiles. The widths and gap distances of the P-type buried rings 118 are mainly defined by the photomask used for forming the patterned mask layer 121. In the embodiments, the P-type buried rings 118 are separated from each other by the N-type well region 117. The gap distances between the P-type buried rings 118 may be equal or different. In addition, since the P-type buried rings 118 are simultaneously formed by the same implanting process, the P-type buried rings 118 have the same depths and thicknesses. Moreover, total dopant quantities of the P-type buried rings 118 are in proportion to widths thereof. The doped profiles of the P-type buried rings 118 gradually become smaller (or narrower) with a linear relation. Specifically, the P-type dopant quantities (or carrier quantities) gradually become less with a linear relation, in a direction from the left side to right side of the N-type well region 117. Thus, the surface doping concentration of the N-type well region 117 gradually becomes higher in a direction from the left to the right. In the embodiments, the P-type buried ring 118 has a thickness of 24 μm to 65 μm and a depth of 0 μm to 10 μm. The gap distance between the adjacent P-type buried rings 118 is between 1 μm to 3 μm.

The carrier quantity and the depth (or thickness) of the P-type buried rings 118 may be controlled by adjusting the implanting parameters such as the dosage, energy, and impurity of the doping process, and the annealing parameters such as the annealing temperature and annealing time. The P-type dopant for the P-type buried ring 118 may comprise boron, gallium, aluminum, indium, or combinations thereof. The dosage of dopant may be between about $1\times10^{12}/cm^2$ and about $3\times10^{12}/cm^2$. The implant energy may be between about 1500 keV and about 2000 keV. In the embodiments, the annealing temperature is about 700° C. to about 900° C., and the annealing time is about 90 minutes to about 120 minutes. Accordingly, the profile distribution of the P-type buried ring 118 can be controlled by a lithography and implanting process using only one (photo)mask. Also, the method is simple, and does not require much additional costs.

Referring to FIG. 7, a dielectric layer 140 is formed on the P-type buried ring 118. As illustrated in FIG. 7, the dielectric layer 140 may be a local oxidation dielectric structure. In one embodiment, the local oxidation dielectric structure 140 is formed by forming a patterned mask layer (not shown) on the N-type well region 117, then etching the material, for example, a silicon oxide or silicon nitride, on the surface of N-type well region 117, and then oxidizing a silicon of the N-type well region 117 exposed by the patterned mask. Alternatively, the dielectric layer 140 may also be formed by a conventional method, such as etching the N-type well region 117 exposed by the mask layer to form a trench, and then filling the trench with a dielectric material such as an oxide. Next, the mask layer may be removed. The thickness of the dielectric layer 140 is between 5000 angstrom to 8000 angstrom, but is not limited thereto.

Referring to FIG. 8, a dielectric layer 120 is formed on the P-type well region 115 and the N-type well region 117. The dielectric layer 120 is thinner than the dielectric layer 140. The thickness of the dielectric layer 120 may be between 500 angstrom to 1000 angstrom. The dielectric layer 120 may comprises an oxide formed on the surface of the P-type well region 115 and the N-type well region 117 by thermal oxidation. The dielectric layer 120 may also comprise, for example, silicon dioxide, silicon oxynitride or silicon nitride, high-k dielectric or combinations thereof. The dielectric layer 120 may also be composed of one or more materials comprising $Al_2O_3$, $HfO_2$, HfON, $HfSiO_4$, $ZrO_2$, ZrON, $ZrSiO_4$, $Y_2O_3$, $La_2O_3$, $CeO_2$, $TiO_2$, or $Ta_2O_5$. The dielectric layer 120 may be formed by chemical vapor deposition such as a low-temperature chemical vapor deposition, low-pressure chemical vapor deposition, rapid-thermal chemical vapor deposition, plasma chemical vapor deposition, or sputtering and physical vapor deposition process. In one embodiment, the dielectric layer 120 and 140 are both silicon dioxides.

Figure 9:
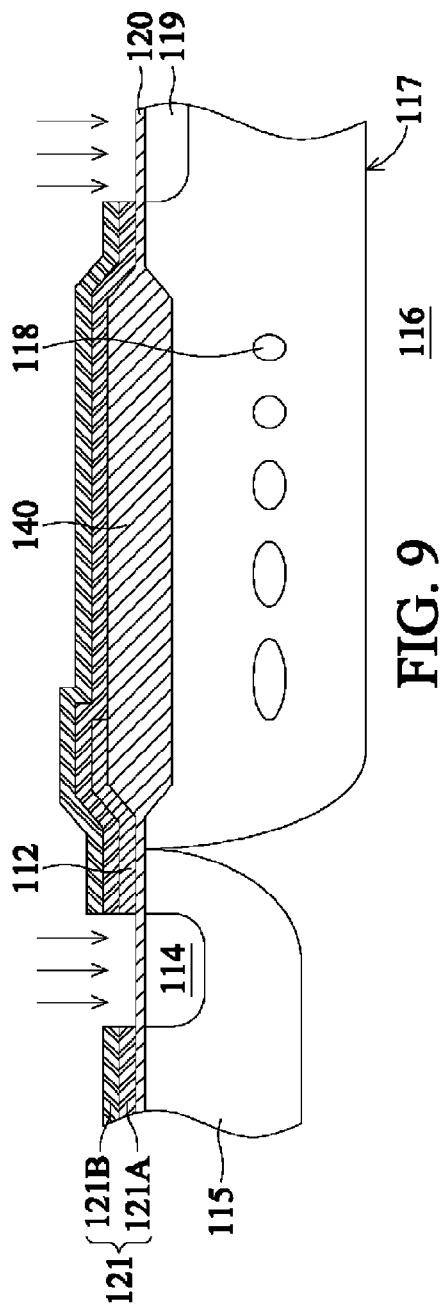

Referring to FIG. 9, an electrode layer 112 is formed on the dielectric layer 120. The electrode layer 112 may be extended on the dielectric layer 140, as shown in FIG. 9. In one embodiment, the electrode layer 112 is made of a polysilicon. However, the electrode layer 112 may also comprise other suitable materials such as Ti, TiN, Ta, TaN, Cu, Al, Mo, Co, W, WN, MoSi, WSi, CoSi, etc.

Referring to FIG. 9, an N$^+$-type diffused region 114 is formed in the P-type well region 115, and an N$^+$-type diffused region 119 is formed in the N-type well region 117. The N$^+$-type diffused region 114 and the N$^+$-type diffused region 119 may be formed by a conventional lithography process for forming a patterned mask layer 121 on the P-type well region 115 and the N-type well region 117. An N-type dopant is implanted into the P-type well region 115 and the N-type well region 117, and then the patterned mask layer 121 is removed. The N-type dopant may comprise phosphorus, arsenic, nitrogen, antimony, or combinations thereof. The mask layer 121 is not illustrated in detail for brevity since it is similar with the mask layer 121 shown in FIGS. 5 and 6.

Figure 10:
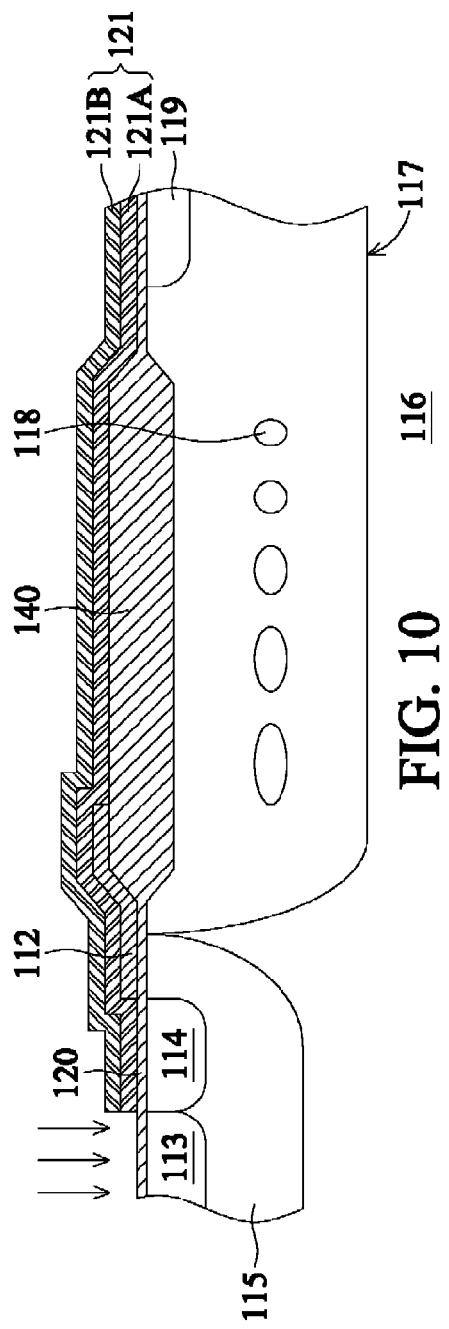

Referring to FIG. 10, a P$^+$-type diffused region 113 is formed in the P-type well region 115. The P$^+$-type diffused region 113 may be formed by a conventional lithography process for forming a patterned mask layer 121 on the P-type well region 115 and the N-type well region 117. A P-type dopant is implanted into the P-type well region 115, and then the patterned mask layer 121 is removed. The P-type dopant may comprise boron, gallium, aluminum, indium, or combinations thereof. The mask layer 121 is not illustrated in detail for brevity since it is similar with the mask layer 121 shown in FIGS. 5 and 6. In the embodiments, the width of the N$^+$-type diffused region 119 is about 75 μm to 80 μm. The width of the N$^+$-type diffused region 114 is about 10 μm to 18 μm. The width of the P$^+$-type diffused region 113 is about 0 μm to 10 μm.

Figure 11:
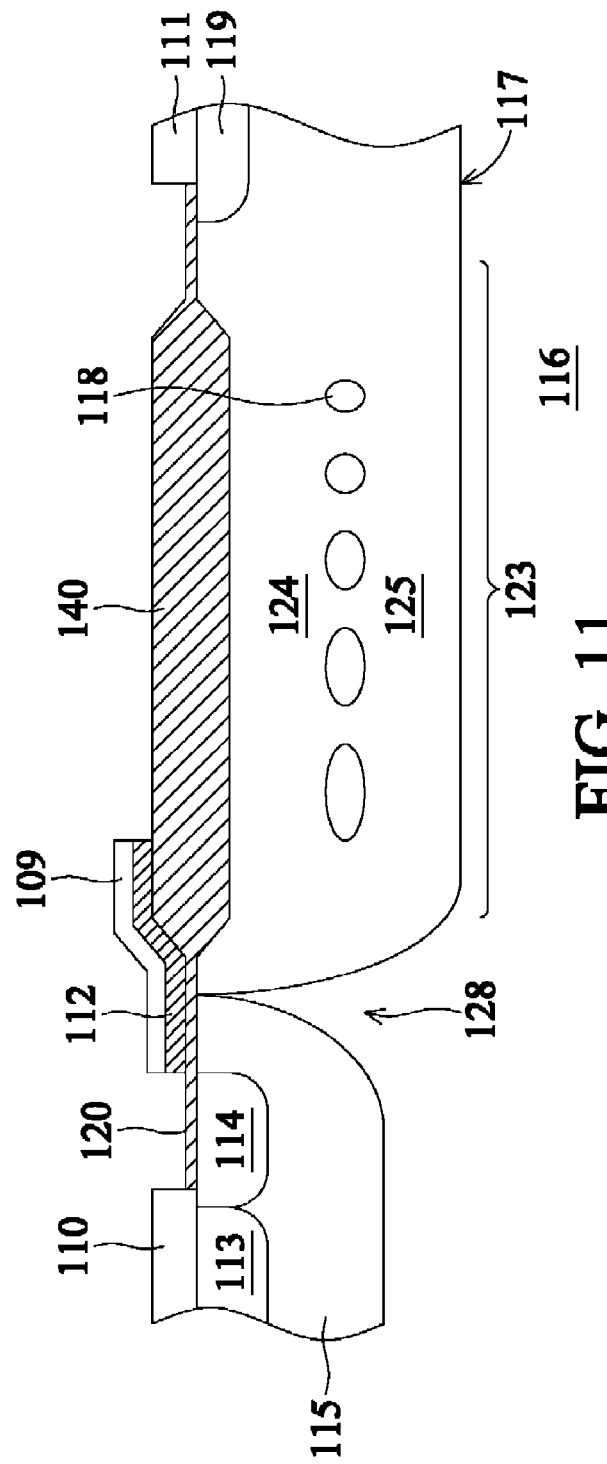

Referring to FIG. 11, the dielectric layer 120 on the N$^+$-type diffused region 119, N$^+$-type diffused region 114 and P$^+$-type diffused region 113 is removed by a lithography and etching process, and then, a conductive layer 111 is formed on the N$^+$-type diffused region 119, a conductive layer 110 is formed on the N$^+$-type diffused region 114 and P$^+$-type diffused region 113, and a conductive layer 109 is formed on the electrode layer 112. In one embodiment, the conductive layers 109, 110 and 111 are formed simultaneously. The conductive layers 109, 110 and 111 may comprise metals or an alloy or other suitable materials. For example, the conductive layers 109, 110 and 111 may be aluminum or titanium alloy.

FIG. 11 illustrates the finished LDMOS structure. In the LDMOS structure, the N$^+$-type diffused region 114 serves as the source, and the N$^+$-type diffused region 119 serves as the drain. The channel region 128 is disposed between the N$^+$-type diffused region 114 and N-type well region 117. The gate comprising the dielectric layer 120 serving as the gate insulating layer and the electrode layer 112 serving as the gate electrode layer is disposed on the channel 128 and serves to control the current for the transistor. In addition, the N-type well region 117 below the dielectric layer 140 serves as the drift region 123 for connecting the N$^+$-type diffused source 114 with the N$^+$-type diffused drain 119. Proper threshold voltage of the channel 128 is achieved by adjusting the dosage of the dopant when forming the N$^+$-type diffused source 114 and the N-type well region 117.

The conductive layer 110 can be used as the source electrode, providing an electrical connection to the N$^+$-type diffused source 114. The conductive layer 111 can be used as the drain electrode, providing an electrical connection to the N$^+$-type diffused drain 119. Note that because the P$^+$-type diffused region 113 is adjacent to the N$^+$-type diffused source 114, susceptibility to parasitic bipolar effect and body effect is reduced.

In one embodiment, the drift region 123 is entirely covered by the thicker dielectric layer 140 (as shown in FIG. 11). In other embodiments, only a part of the drift region 123 is covered by the dielectric layer 140. Alternatively, the drift region 123 may not comprise a dielectric layer. By using a thicker dielectric layer 140, the vertical electrical field effect generated from the gate edge may be reduced. Thus, breakdown voltage of the device may be increased. In one embodiment, the drain electrode 111 may be extended on the dielectric layer 140 (not shown) to serve as a field plate. In addition, the gate electrode layer 112 can also serve as a field plate as it is extended on the dielectric layer 140 (as shown in FIG. 11). The above-described field plate structure can be used for improving the electrical field distribution to decrease the electrical field crowding effect so as to improve breakdown voltage of a transistor.

Referring to FIG. 11, the doped profiles of the P-type buried rings 118 gradually become smaller in a direction from left to right. Specifically, the surface concentration of the N-type drift region 123 nearer to the channel region 128 is higher than that nearer to the N$^+$-type drain 119. Thus, in the off-state device, the portion of the N-type drift region 123 nearest to the channel region 128 is more easily fully depleted than that nearest to the N$^+$-type drain 119, resulting in the device to have a lower saturated current at a same bias voltage. In addition, the negative charges generated from the P-type buried rings 118 of varied profiles with a linear relation induce an additional electrical field opposite to the intrinsic field. The new peak electrical field generated at the edge of each P-type buried rings 118 can reduce the peak electrical field of the main junction edge to improve charge equilibrium. Therefore, electrical distribution is redistributed, and breakdown voltage of the device is increased. The increased breakdown voltage can be optimized by adjusting the widths of the buried rings and the gap distance between the buried rings. The switching speed of the device can be increased while also increasing the breakdown voltage.

As the LDMOS is in an on-state, the electron from the N$^+$-type diffused source 114 passes through the channel region 128, and then through the dual parallel conducting channel constructed by the upper drift region 124 and the lower drift region 125, before finally passing to the N$^+$-type diffused drain 119. The carrier conductivity of the device can be dramatically increased by using the described dual parallel conducting channel. Moreover, the P-type substrate 116 is disposed under the N-type well region 117, the N-type well region 117 has P-type buried rings 118 therein, and the P-type buried rings 118 and the N-type well region 117 have a large contact area therebetween. Thus, in an off-state LDMOS, the N-type well region 117 can be depleted easily. Therefore, the N-type well region 117 can be formed with a high dopant concentration. Meanwhile, since the P-type buried rings 118 occupies only a small portion of the N-type drift region 123, the channel provided from the N-type drift region 123 is not reduced. Therefore, on-resistance of a device can be reduced.

In one embodiment, the length of the N-type drift region is about 55 μm. In one embodiment, the charge concentration of the upper drift region 124 is about $2.8 \times 10^{12}$ cm$^{-2}$, the charge concentration of the lower drift region 125 is about $2.7 \times 10^{12}$ cm$^{-2}$, and the charge concentration of the P-type buried rings 118 is about $2.4 \times 10^{12}$ cm$^{-2}$. In other embodiments, the total net carrier of the upper N-type drift region 124 and the lower N-type drift region 125 is about $3 \times 10^{12}$ cm$^2$, which is more than three times that of the conventional single RESURF LDMOS, or two times that of the conventional double RESURF LDMOS. In other words, the resistance of the drift region of the LDMOS of the present invention is reduced to one third of the conventional device. Therefore, the device of the present invention has low on-resistance. In the embodiments, the breakdown voltage is higher than 800V, for example, between 800V to 900V, and the on-resistance is lower than 110 mΩcm², for example, between 100 mΩcm² to 110 mΩcm².

Figure 13:
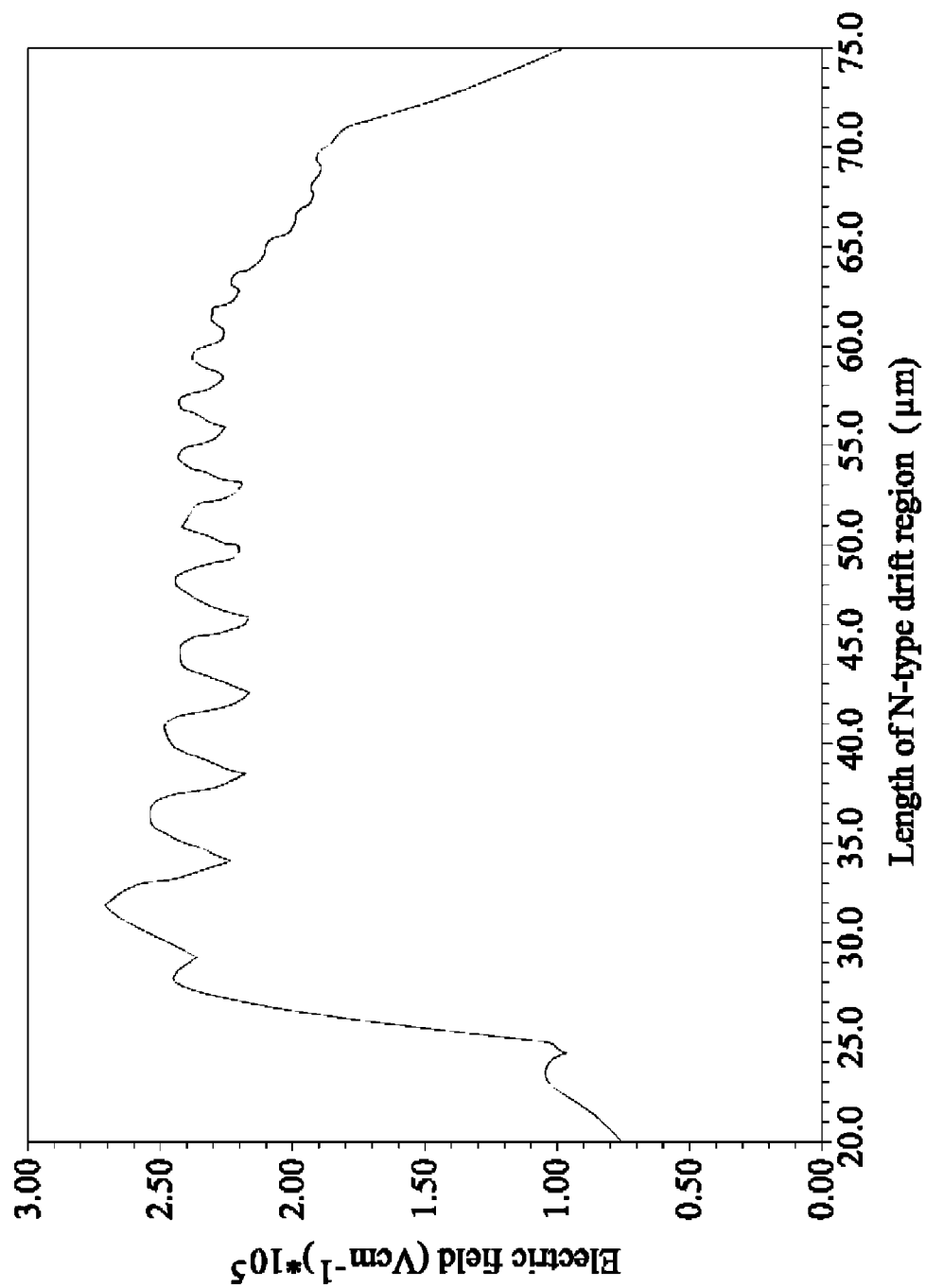
FIG. 13 is an analysis diagram of a structure having 17 of the P-type buried rings of the embodiment of the present invention.
Figure 14:
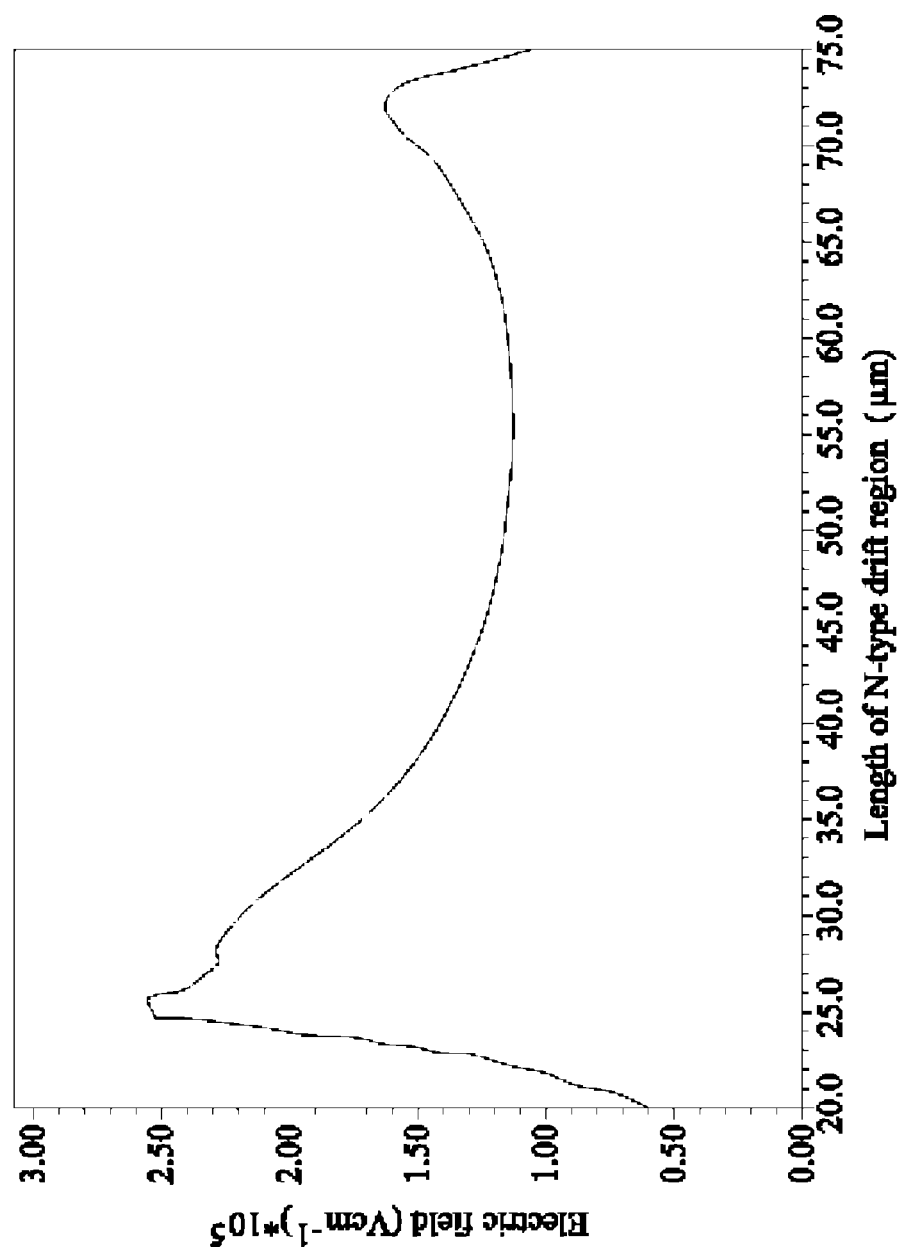
FIG. 14 is an analysis diagram of a conventional structure without the P-type buried ring.

FIG. 13 is an analysis diagram of a structure having 17 of the P-type buried rings of the embodiment of the present invention. FIG. 14 is an analysis diagram of a conventional structure without the P-type buried ring. When comparing FIG. 13 and FIG. 14, it is found that the electric field of the N-type drift region of FIG. 13 is uniformly distributed. Thus, the device of the present invention has higher breakdown voltage. However, the electric field at the end of the N-type drift region in FIG. 13 is found as abruptly rising. Thus, the device of the present invention has lower breakdown voltage.

Figure 12:
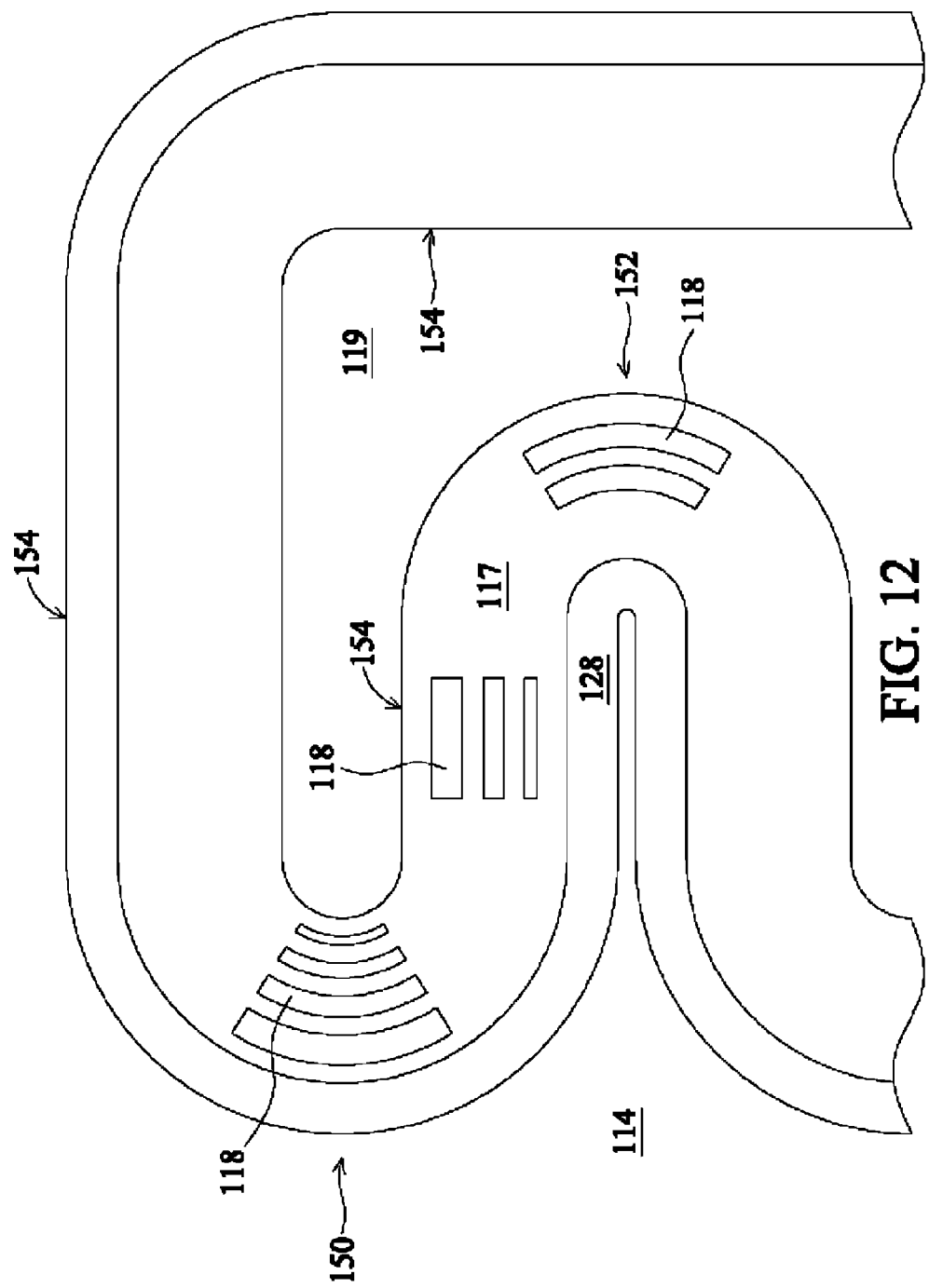
FIG. 12 is a top view of a semiconductor structure of one embodiment of the present invention.

The described concept of the present invention can be applied to an LDMOS device of an interdigitated structure. In the conventional technique, the length of a ??? of a device must be as long as possible to obtain a high driving current. Thus, the LDMOS of the interdigitated structure generally comprises bent portions for efficient wafer utilization. As a result, when operating the LDMOS device of the interdigitated structure, a crowding electric field effect occurs at the finger end with the curved surface (referring to FIG. 12, for example, a finger end of a drain center 150, and finger end of a source center 152). Thus, breakdown voltage of the device is decreased. This problem is compounded when a device is further scaled-down. For example, as a width of the straight finger body (refer the finger body 154 as shown in FIG. 12) or a radius of curvature of the finger end is reduced, crowding electric field effect becomes more serious. However, in the conventional technique if the width of the finger end is widened to enlarge the radius of curvature in order to increase the breakdown voltage and eliminate the problems mentioned above, layout flexibility of the device utilizing the technique is sacrificed. Thus, further scaling-down of related devices are hindered. Accordingly, the embodiments of the present invention apply a plurality of P-type buried rings in the device of the interdigitated structure to prevent the crowding electrical field effect at the finger end.

FIG. 12 is a top view of an LDMOS of an interdigitated structure according to one embodiment of the present invention. FIG. 12 illustrates the top portions of the P-type buried rings 118, N⁺-type diffused source 114, channel region 128, N-type well region 117 and N⁺-type diffused drain 119 as shown in FIG. 11, and omits other elements. Note that FIG. 12 is drawn in abstract terms to reveal the spirit of the embodiment of the present invention. Thus, the distribution of the P-type buried rings 118 is not completely shown. As an example, the P-type buried rings 118 may also have a race-track-like structure that continuously extends throughout a whole device. Alternatively, the P-type buried rings 118 in different regions may be connected to each other.

In the embodiments, the N-type well regions 117 of the finger end of the drain center 150, the finger end of the source center 152 and the straight finger body 154 have P-type buried rings of different distributions. Therefore the N-type well regions 117 in different regions have different surface doping concentrations. To properly adjust the breakdown voltage of a device, the surface doping concentration of the drift region in the finger end of the drain center 150 may be decreased, and the surface doping concentration of the drift region in the finger end of the source center 152 may be increased. In other words, the total charge quantity of the P-type buried rings in the finger end 150 should be larger than that in the finger end 152. In one embodiment, the number of the P-type buried rings in the finger end 150 is larger than that in the finger end 152. In addition, to properly adjust the respective breakdown voltages of different regions of a device, simultaneously, the doping profiles of the P-type buried rings may gradually become smaller in a direction from the channel region to the drain in the finger end 150, finger end 152, or finger end 154, respectively. Therefore, the LDMOS of the interdigitated structure of the present invention obtains improved control breakdown voltage without increasing the area of a device. In addition, the P-type buried rings of different distributions in the different regions may be easily formed by a lithography and implanting process using only one (photo)mask. Thus, the method is simple, and does not require much additional costs. In the embodiments, the breakdown voltage of the device is higher than 800V, for example, between 800V to 900V, and the on-resistance is lower than 110 mΩcm², for example, between 100 mΩcm² to 110 mΩcm².

The embodiments of the present invention provide the following advantages. An electrical field of an off-state device is improved. Specifically, an N-type drift region of an NLDMOS has a plurality of P-type buried rings with doping profiles that gradually become smaller in a direction from a source to a drain and are separated from each other. Thus, a crowding electrical field effect is prevented and breakdown voltage is increased. In addition, the N-type well region can be formed with a high dopant concentration, so that the conducting channel ratio of the N-type drift region does not decrease due to the P-type buried rings. Thus, the on-resistance of a device can be reduced. Moreover, the P-type buried rings are easily formed by a lithography and implanting process using only one (photo)mask. Thus, the method is simple, and does not require much additional costs. Accordingly, the simple method of the present invention can be applied to the UHV technique, to simultaneously increase breakdown voltage and decrease on-resistance of an LMOS.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). For example, when describing one embodiment of an NLDMOS, another embodiment can be a PLDMOS. Therefore, the scope of the appended claims should be accorded the broadest interpretation so as to encompass all such modifications and similar arrangements.

What is claimed is:

1. A semiconductor structure, comprising:
    a first conductivity type substrate;
    a second conductivity type well region on the first conductivity type substrate;
    a second conductivity type diffused source and a second conductivity type diffused drain on the first conductivity type substrate;
    a gate structure on the second conductivity type well region between the second conductivity type diffused source and the second conductivity type diffused drain; and
    first conductivity type buried rings arranged in a horizontal direction and formed in the second conductivity type well region, dividing the second conductivity type well region into an upper drift region and a lower drift region,
    wherein the semiconductor structure comprises a lateral diffused metal oxide semiconductor transistor with breakdown voltage which is higher than 800V and on-resistance which is lower than 110 mΩcm².

2. The semiconductor structure as claimed in claim 1, wherein the first conductivity type buried rings have the same depths.

3. The semiconductor structure as claimed in claim 1, wherein doped profiles of the first conductivity type buried rings become smaller in a direction from the second conductivity type diffused source to the second conductivity type diffused drain.

4. The semiconductor structure as claimed in claim 1, wherein total dopant quantities or net charges of the first conductivity type buried rings become less in a direction from the second conductivity type diffused source to the second conductivity type diffused drain.

5. The semiconductor structure as claimed in claim 1, wherein a surface doping concentration or net charges of the second conductivity type well region becomes higher in a direction from the second conductivity type diffused source to the second conductivity type diffused drain.

6. The semiconductor structure as claimed in claim 1, wherein the first conductivity type buried rings are separated from each other.

7. The semiconductor structure as claimed in claim 1, wherein the semiconductor structure has an interdigitated finger shaped structure comprising a finger end of the second conductivity type diffused source-center and a finger end of the second conductivity type diffused drain-center, wherein a net charge of the first conductivity type buried rings of the finger end of the second conductivity type diffused source-center is less than a net charge of the first conductivity type buried rings of the finger end of the second conductivity type diffused drain-center.

8. The semiconductor structure as claimed in claim 7, wherein the number of first conductivity type buried rings of the finger end of the second conductivity type diffused source-center is smaller than the number of first conductivity type buried rings of the finger end of the second conductivity type diffused drain-center.

9. The semiconductor structure as claimed in claim 7, wherein a layout of the first conductivity type buried rings of the finger end of the second conductivity type diffused source-center and a layout of the first conductivity type buried rings of the finger end of the second conductivity type diffused drain-center are different.

10. The semiconductor structure as claimed in claim 7, wherein doped profiles of the first conductivity type buried rings of the finger end of the second conductivity type diffused source-center and drain-center become smaller in a direction from the second conductivity type diffused source to the second conductivity type diffused drain.

11. A method for forming the semiconductor structure, comprising:
   providing a first conductivity type substrate;
   forming a second conductivity type well region on the first conductivity type substrate;
   forming a second conductivity type diffused source and a second conductivity type diffused drain on the first conductivity type substrate;
   forming a gate structure on the second conductivity type well region between the second conductivity type diffused source and the second conductivity type diffused drain; and
   forming first conductivity type buried rings arranged in a horizontal direction in the second conductivity type well region, wherein the first conductivity type buried rings divide the second conductivity type well region into an upper drift region and a lower drift region
   wherein the semiconductor structure comprises a lateral diffused metal oxide semiconductor transistor with breakdown voltage which is higher than 800V and on-resistance which is lower than 110 m$\Omega$cm$^2$.

12. The method for forming the semiconductor structure as claimed in claim 11, wherein the first conductivity type buried rings have the same depths.

13. The method for forming the semiconductor structure as claimed in claim 11, wherein doped profiles of the first conductivity type buried rings become smaller in a direction from the second conductivity type diffused source to the second conductivity type diffused drain.

14. The method for forming the semiconductor structure as claimed in claim 11, wherein total dopant quantities or net charges of the first conductivity type buried rings become less in a direction from the second conductivity type diffused source to the second conductivity type diffused drain.

15. The method for forming the semiconductor structure as claimed in claim 11, wherein a surface doping concentration or net charges of the second conductivity type well region becomes higher in a direction from the second conductivity type diffused source to the second conductivity type diffused drain.

16. The method for forming the semiconductor structure as claimed in claim 11, wherein the first conductivity type buried rings are separated from each other.

17. The method for forming the semiconductor structure as claimed in claim 11, wherein the semiconductor structure has an interdigitated finger shaped structure comprising a finger end of the second conductivity type diffused source-center and a finger end of the second conductivity type diffused drain-center, and a net charge of the first conductivity type buried rings of the finger end of the second conductivity type diffused source-center is less than a net charge of the first conductivity type buried rings of the finger end of the second conductivity type diffused drain-center.

* * * * *